United States Patent [19]

Anderson

[11] Patent Number: 4,610,082

[45] Date of Patent: Sep. 9, 1986

[54] AUTOMATED EDGE CONNECTOR ASSEMBLY

[75] Inventor: Daniel J. Anderson, Elmhurst, Ill.

[73] Assignee: Molex Incorporated, Lisle, Ill.

[21] Appl. No.: 799,891

[22] Filed: Nov. 20, 1985

[51] Int. Cl.[4] .............................................. H05K 3/36

[52] U.S. Cl. ...................................... 29/741; 29/739; 29/759; 29/830

[58] Field of Search ................ 29/739, 741, 759, 830, 29/837-839, 845

[56] References Cited

U.S. PATENT DOCUMENTS 4,477,969 10/1984 Cabaud ................................ 29/739

*Primary Examiner*—Carl E. Hall

*Attorney, Agent, or Firm*—Louis A. Hecht

[57] ABSTRACT

A robotic tool for mounting an edge connector on a mother board, and mounting a daughter board to the edge connector. The mother and daughter boards are of the printed circuit board type, with the edge connector including a plurality of terminals mounted in a socket for receiving an edge of the daughter board at a first angle, and for electrically mating with the edge of the daughter board when the daughter board is rotated to a second angle. The tool includes a programmable robotic arm selectively moveable to a predetermined position on the mother board, and having a free end with a pair of end portions moveable toward and away from each other. A pair of jaws are mounted to the end portions, for movement therewith. The jaws have first outwardly extending connector engaging portions and second inwardly opening daughter board-receiving recesses. The same jaws are used to mount the edge connector to the mother board, and to insert and rotate the daughter board for mating and locking with the edge connector.

2 Claims, 9 Drawing Figures

AUTOMATED EDGE CONNECTOR ASSEMBLY

BACKGROUND OF THE INVENTION

1. Field of the Invention

The present invention pertains to robotic tools for mounting an edge connector to a predetermined location on a mother board of the printed circuit board type, and mounting a daughter board of the printed circuit type to the edge connector. More particularly, the invention pertains to an edge connector-daughter board combination wherein the daughter board is inserted in a socket portion of the edge connector at a first angle, and is rotated to a second angle to lock the daughter board to the edge connector.

2. Brief Description of the Prior Art

Manufacturers of electronic appliances realize significant cost advantages by using automated assembly techniques wherever possible. Electronic appliances frequently include one or more printed circuit boards that must be populated with a variety of electronic components. Programmable manipulators, or robotic arms are employed to pick components from a supply source and accurately place those components on the printed circuit board. An example is given in United Kingdom Patent Application Serial No. 2,131,331 filed May 24, 1983. In that application, leaded components are placed on a printed circuit board for a subsequent soldering operation.

Further cost savings can be realized if additional steps can be performed with the same robotic arm. For example, the edge card connector described and claimed in commonly owned U.S. patent application Ser. No. 727,714, filed Apr. 26, 1985, must receive a daughter board of the printed circuit board type to complete its assembly. This particular type of edge card connector is a "zero force" connector, requiring the daughter board to be inserted therein at a first angle, and rotated to a second angular position to electrically mate the daughter board with the connector.

Robotic arms are relatively expensive in themselves, and often require a host of costly auxiliary systems surrounding their work site, to provide a cost efficient automated operation. A duplication of robotic work stations is therefore avoided, if at all possible. It is common for multi-purpose robotic arms to have quick-change couplings at their working free end. This allows the robotic arm programmable access to a variety of work tools. However, even the quick-change couplings are significantly expensive, and accordingly, any multi-purpose working tools that can be made available to a robotic arm offer significant cost advantages. Also, the real estate surrounding the robotic arm (its working area) is quite valuable, and multifunction tools save space for other robotic operations.

SUMMARY OF THE INVENTION

Accordingly, it is an object of the present invention to provide a multipurpose working tool for a robotic arm.

It is a particular object of the present invention to provide a multipurpose working tool for mounting an edge connector to a predetermined location on a mother board, and mounting a daughter board to the edge connector.

These and other objects of the present invention are provided in a robotic tool for mounting an edge connector to a predetermined location on a mother board, and mounting a daughter board to the edge connector, the edge connector including a plurality of terminals, each having a board engaging portion mounted in a socket which receives an edge of the daughter board which is inserted at a first angle and is rotated to a second angle to lock the daughter board to the edge connector so that the board engaging portion of the terminals are electrically mated with the daughter board, the tool including a programmable robotic arm selectively moveable to the predetermined position on the mother board and having a free end with a pair of end portions selectively moveable toward and away from each other. The tool comprises a a pair of jaws moveable toward and away from each other, means for mounting the jaws to the robotic end portions, for movement therewith, the jaws having outwardly extending connector engaging portions for selectively engaging the edge connector while the arm is moved to a predetermined position adjacent the mother board and advanced theretoward, whereby the connector is mounted on the mother board, and the jaws further having opposed inwardly opening pocket-like recesses for receiving, engaging, and supporting the daughter board while the arm is moved to approximately the same predetermined position adjacent the mother board, advanced toward the connector socket at the first angle, and rotated to the second angle, whereby the daughter board is inserted in the connector socket and rotated to the second angle to establish electrical contact between the daughter board and the connector.

BRIEF DESCRIPTION OF THE DRAWINGS

In the drawings, wherein like elements are referenced alike.

DETAILED DESCRIPTION OF THE PREFERRED EMBODIMENT

Figure 1:
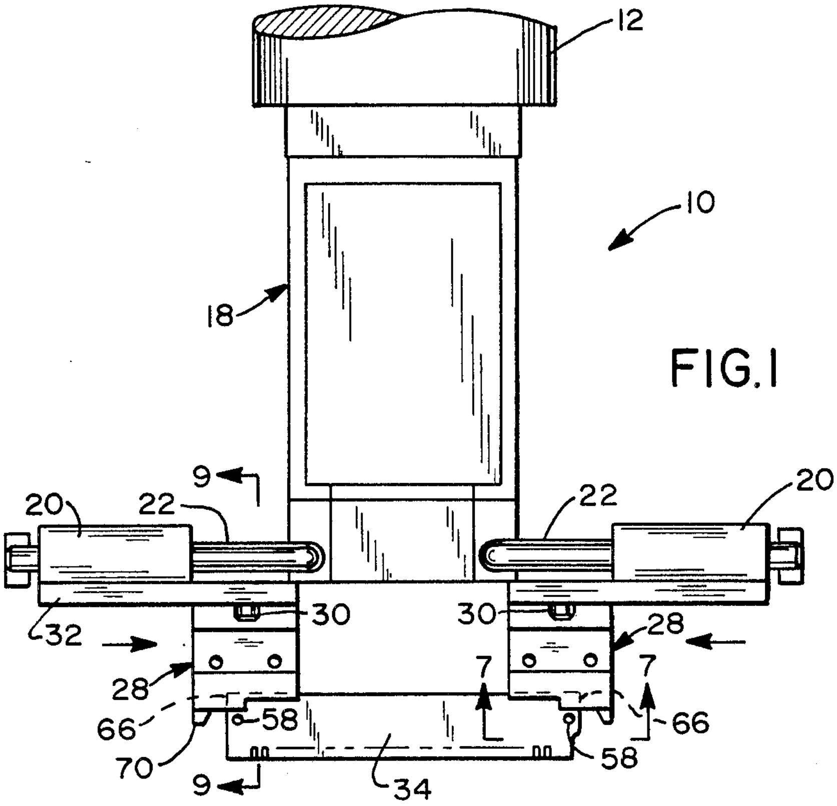
FIG. 1 is an elevation view of the multipurpose tool of the present invention, shown installed at the working end of a robotic arm. The tool is shown grasping a daughter board for installation in an edge connector.
Figure 2:
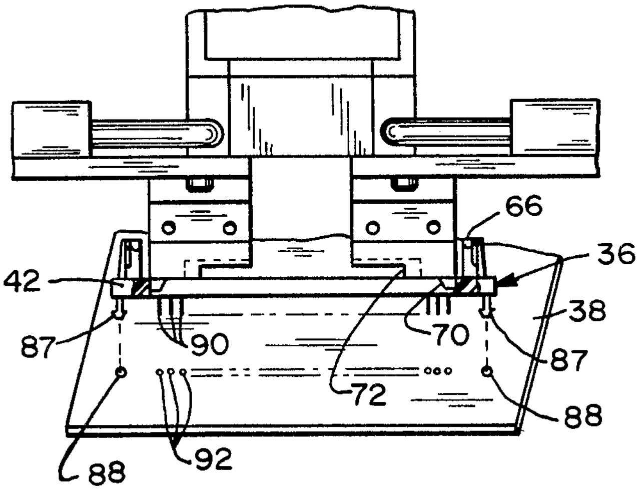
FIG. 2 shows the multipurpose robotic tool of FIG. 1, grasping an edge connector to be mated with the daughter board shown in FIG. 1.

Referring now to the drawings and particularly to FIGS. 1 and 2, the robotic tool according to the present invention is generally indicated at 10. Tool 10 consists of a conventional programmable manipulator or robotic arm 12. As will be apparent to those skilled in the art, the robotic arm 12 must be of a type having at least 5 axes or degrees of freedom. An example of a robotic arm of this type is the INTELLEDEX robot model number 605T, manufactured by by Intelledex Inc. of Corvallis, Oreg. Robotic tool 10 further includes a conventional end effector 18 mounted at the free end of the robotic arm, having at least two systems of force sensors, and a drive mechanism for moving the block-like end portions 20. In the preferred embodiment, the end effector 18 is a small servo end effector part No. 80024, also manufactured by INTELLEDEX INC. of Corvallis, Oreg. The particular end effector unit has a rack and pinion drive mechanism 22, driven by the servo motor, for moving the block-like end portions 20 toward and away from each other.

Typically, the end effector, like other commercially available units, is provided with a simple L-shaped jaw bolted to end portions 20. According to the present invention, these simple jaws have been replaced by a uniquely configured pair of jaws generally indicated at 28. Jaws 28 are mounted to end portions 20 by bolts 30, through an adaptor plate 32.

Figure 3:
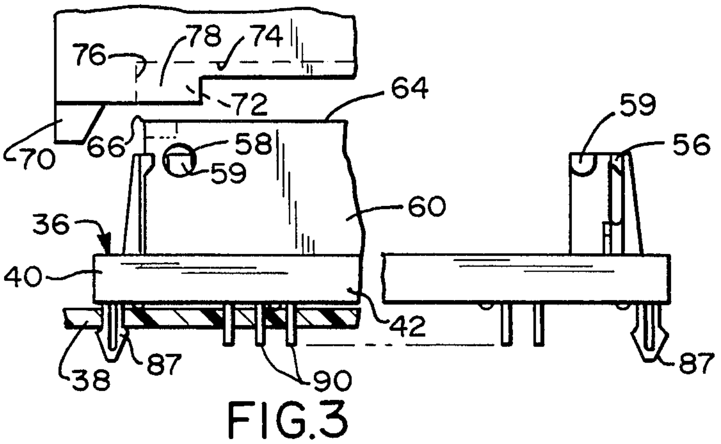
FIG. 3 is an elevation view of the edge connector-daughter board combination to which the present invention is directed.

As indicated in FIGS. 1 and 2, jaws 28 serve a dual purpose, having first portions 72 for gripping a daughter board 34 of the printed circuit type (see FIG. 1) and also having second portions 70 for engaging an edge card connector 36 (see FIG. 2). According to the present invention, the same jaws 28 are used in both functions, without requiring modification to the robotic tool 10. Additionally, as will be appreciated by those skilled in the art, the unique construction of jaws 28, and their mounting to the end effector 18, minimizes any differences in the programming required to direct the robotic arm throughout assembly of the edge connector 36 to a mother board, and the installation of daughter board 34 within the edge connector. FIG. 3 shows a completed installation of daughter board 34 and edge connector 36 installed on a mother board 38 of the conventional printed circuit board type.

Figure 6:
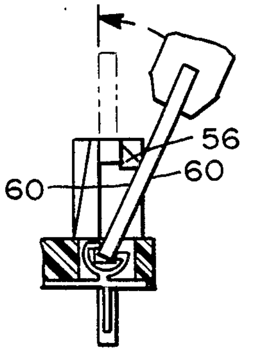
FIG. 6 is an elevation view showing the daughter board being inserted in the edge connector, utilizing the robotic tool of the present invention.
Figure 5:
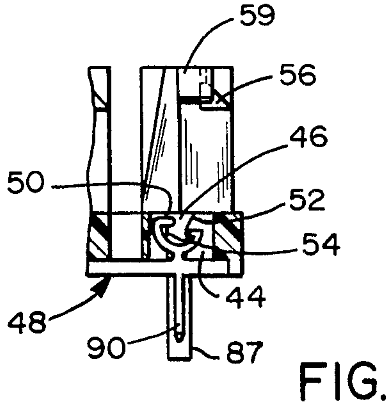
FIG. 5 is a sectional view taken along the lines 5—5 of FIG. 4.
Figure 4:
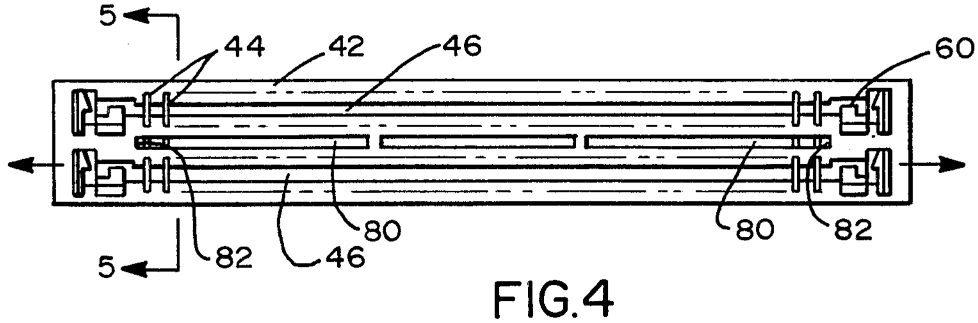
FIG. 4 is a plan view of the edge connector of FIG. 2.

Referring additionally to FIGS. 4–6, the edge connector 36 comprises a dielectric body 40 consisting of a base portion 42 defining terminal receiving slots 44 associated with a board-receiving slot 46. FIG. 5 shows electrical terminals 48 loaded in slots 44, having a generally C-shaped mating portion with a pair of opposed board engaging contacts 50, 52, located one above the other at different vertical orientations. Slot 46 and terminals 48 together comprise an electrical socket for mating with the bottom edge of daughter board 34. Slot 46 has a first angled surface 52 against which the mating daughter board 34 is initially positioned with a zero insertion force. Thereafter, the daughter board is rotated in a counterclockwise direction to contact the second stop surface 54, wherein the upper corners of the daughter board are locked in place by resilient locking fingers 56. As the daughter board is locked in place, alignment apertures 58 located at each upper corner, receive an aligning projection 59. The edge connector 36 is further described in commonly owned U.S. patent application Ser. No. 727,714 filed Apr. 26, 1985, a continuation of U.S. patent application Ser. No. 597,333 filed Apr. 6, 1984), the disclosures of which are herein incorporated by reference.

Referring to FIGS. 1, 3, 6 and 8, the daughter board 34 includes first and second opposed major surfaces 60, one of which receives electrical components for either surface mounting or through-lead mounting, as is known in the art. A pair of opposed end walls 62 extend between the surfaces 60. A top wall 64 also extends between surfaces 60, and meets end wall 62 at each upper corner 66 of board 34. In the preferred embodiment, the daughter board 34 is of a plinth or parallelepiped configuration, and the robotic tool of the present invention includes a pocket-like recess 72 of the same configuration, for receiving an upper corner 66 of the daughter board. However, it will be readily appreciated by those skilled in the art, that the upper corners of daughter board 34 can take on any other convenient configuration, as long as the jaws of the robotic tool are similarly configured in accordance with the principles that will now be explained.

Referring now to FIGS. 1, 2, and 6–9 the dual function jaws 28 include a first outwardly extending finger-like connector engaging portion 70 and an inwardly opening board-receiving recess 72. Recess 72 is of a configuration to ensure adequate support of daughter board 34 during translational insertion in slot 46, and rotational electrical mating and locking relative to the terminals 48 and latches 56 of the edge connector 36. Accordingly, recess 72 includes an upper surface 74 for engaging top wall 64, and an outer end surface 76 for engaging end wall 62. The end effector 18 and robotic arm 12 are programmed such that surface 74 of jaw 28 first engages top wall 64 of the daughter board 34 (with applied force feedback control), and thereafter the servomotor within end effector 18 is actuated to draw the pair of opposed jaws 28 together (also with applied force feedback control), thereby bringing end surfaces 62 thereof in contact with daughter board end walls 62. Feedback control of these two forces are available in commercial end effectors. Pocket-like recesses 72 further include sidewalls 78 for engaging the daughter board surfaces 60 to support the daughter board during rotational mating, and to withstand the opposing forces of terminals 48 and cam-like resilient locking fingers 56. Pocket-like recesses 72 are thereby seen to provide four contiguous surfaces for supporting the corresponding four contiguous surfaces at the corner 66 of daughter board 34 indicated in phantom in FIGS. 3 and 8. As indicated at the top of FIG. 3, recess surface 74 can extend beyond the corner area of board 34, if desired.

Figure 7:
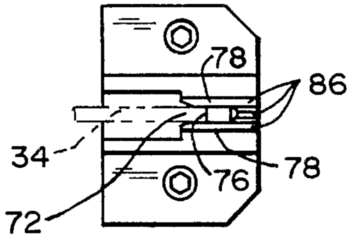
FIG. 7 is a bottom view of a portion of the robotic tool of FIGS. 1 and 2.
Figure 9:
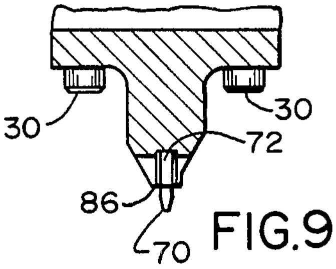
FIG. 9 is a cross sectional view taken along the line 9—9 of FIG. 1.
Figure 8:
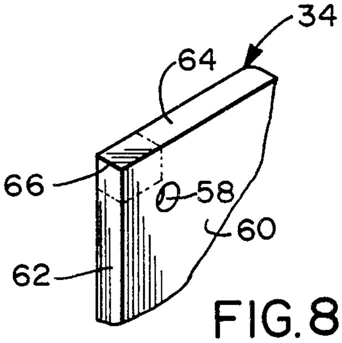
FIG. 8 is an enlarged view of the daughter board of FIGS. 1, 3 and 6.

Referring now to FIGS. 2 and 4, the base 42 of connector body 40 includes a central longitudinal slot 80 having end portions 82. The end effector 18 and robotic arm 12 are programmed so as to insert the connector engaging projections 70 within slot 80. Thereafter, the servomotor within end effector 18 is energized so as to spread the pair of opposing jaws 28 apart, bringing projections 70 into engagement with the end portions 82 of slot 80. As shown in FIGS. 7 and 9, projection 70 is surrounded on three sides by shoulders 86 which engage portions of connector base 42 immediately adjacent slot 80, to provide the downward pressure necessary to seat the leaded connector 36 in mother board 38. In the preferred embodiment, downwardly extending locking tangs or projections 87 are provided to engage the underside surface of mother board 38, providing locking securement as is known in the art. Locking projections 86 are accurately dimensioned to cooperate with apertures 88 of the mother board (see FIG. 2), to provide accurate alignment of the terminal solder tails 90 in mother board through-holes 92.

As can be seen from the above, the jaws 28 of the present invention engage board 34 and connector 36 with minimum contact surfaces in each of their dual functions, and are thereby of minimum size and weight so as not to overload the lifting capacity of robotic arm 12 or end effector 18. Connector engaging projections 70 engage edge connector 36 only at points immediately adjacent the locking tangs 87. The pocket-like recess 72 engages daughter board 34 only at the upper outer corners, at places immediately adjacant the resilient locking fingers 56. In mating daughter board 34 to edge connector 36, jaws 28 provide the necessary registration between daughter board and connector, the downward force necessary to seat the daughter board 34 in the connector socket, and to impart the torsional mating and locking force to the upper portions of daughter board 34, so as to pivot the board at or near its bottom edge.

With the present invention, the same jaws 28 provided both functions, thereby eliminating the cost, storage space, and quick-change coupling required for a second robotic tool. Further, those skilled in the art will readily appreciate that the dual function tool of the present invention significantly reduces the programming necessary to locate the robotic arm 12 and effector 18 during each function. That is, the predetermined programmed position of jaws 28 above mother board 38 (see FIG. 2) is the same for both connector mounting and daughter board inserting functions. The realignment and recalibration necessary when a connector-engaging jaw is removed and a board-engaging jaw is picked up, is eliminated by the present invention.

I claim:

1. A robotic tool for mounting an edge connector to a predetermined location on a mother board, and mounting a daughter board to said edge connector, said edge connector including a plurality of terminals, each having a board engaging portion mounted in a socket which receives an edge of the daughter board which is inserted at a first angle and is rotated to a second angle to lock said daughter board to said edge connector so that the board engaging portion of the terminals are electrically mated with said daughter board, said tool including a programmable robotic arm selectively moveable to said predetermined position on the mother board and having a free end with a pair of end portions selectively moveable toward and away from each other, the tool comprising:

a pair of jaws moveable toward and away from each other;

means for mounting the jaws to the robotic end portions, for movement therewith;

said jaws having outwardly extending connector engaging portions for selectively engaging the edge connector while said arm is moved to a predetermined position adjacent said mother board and advanced theretoward, whereby the connector is mounted on the mother board; and said jaws further having opposed inwardly opening pocket-like recesses for receiving, engaging, and supporting said daughter board while said arm is moved to approximately the same predetermined position adjacent said mother board, advanced toward the connector socket at said first angle, and rotated to said second angle, whereby the daughter board is inserted in said connector socket and rotated to said second angle to establish electrical contact between the daughter board and the connector.

2. The tool of claim 1 wherein the edge connector has a tool receiving slot, and the board engaging recesses of said jaws are located above the connector engaging portions, to allow insertion thereof in said connector slot.

* * * * *